United States Patent
Martirosian et al.

(10) Patent No.: US 8,203,178 B2
(45) Date of Patent: *Jun. 19, 2012

(54) SYSTEM AND METHOD FOR REDUCING PROCESS-INDUCED CHARGING

(75) Inventors: Ashot Melik Martirosian, Sunnyvale, CA (US); Zhizheng Liu, San Jose, CA (US); Mark Randolph, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/860,074

(22) Filed: Aug. 20, 2010

(65) Prior Publication Data

US 2010/0314753 A1     Dec. 16, 2010

Related U.S. Application Data

(60) Continuation of application No. 11/782,507, filed on Jul. 24, 2007, now Pat. No. 7,804,125, which is a division of application No. 11/146,126, filed on Jun. 7, 2005, now Pat. No. 7,262,095.

(51) Int. Cl.
*H01L 21/336* (2006.01)

(52) U.S. Cl. ............ 257/321; 257/314; 257/E21.577; 257/E21.682

(58) Field of Classification Search .............. 257/314, 257/321
See application file for complete search history.

(56) References Cited

U.S. PATENT DOCUMENTS

| | | | |
|---|---|---|---|
| 4,734,384 A | 3/1988 | Tshchiya | |
| 4,786,954 A | 11/1988 | Morie et al. | |
| 4,823,175 A | 4/1989 | Fontana | |
| 4,830,978 A | 5/1989 | Teng et al. | |
| 5,021,854 A | 6/1991 | Huth | |
| 5,200,353 A | 4/1993 | Inuishi | |
| 5,286,982 A | 2/1994 | Ackley et al. | |
| 5,538,906 A | 7/1996 | Aoki | |
| 5,978,258 A | 11/1999 | Manning | |
| 6,214,668 B1 | 4/2001 | Hsu et al. | |
| 6,291,307 B1 | 9/2001 | Chu et al. | |
| 6,576,548 B1 | 6/2003 | Tu et al. | |
| 6,635,528 B2 | 10/2003 | Gilbert et al. | |
| 6,744,139 B2 | 6/2004 | Shimizu et al. | |
| 6,847,087 B2 | 1/2005 | Yang et al. | |
| 7,262,095 B1 | 8/2007 | Martirosian et al. | |
| 7,804,125 B2 * | 9/2010 | Martirosian et al. | 257/321 |
| 2005/0062098 A1 | 3/2005 | Mahajani et al. | |

OTHER PUBLICATIONS

Co-pending U.S. Appl. No. 11/782,507, filed Jul. 24, 2007 entitled "System and Method for Reducing Process-Induced Charging" by Ashot Melik Martirosian et al., 20 pages.
2002 IEEE International Solid-State Circuits Conference, Session 6, "SRAM and Non-Volatile Memories," Feb. 4, 2004, 6 pages.
2002 IEEE International Solid-State Circuits Conference, 23 pages.

* cited by examiner

*Primary Examiner* — Alexander Ghyka
(74) *Attorney, Agent, or Firm* — Harrity & Harrity, LLP

(57) ABSTRACT

A semiconductor device includes a substrate, a memory cell formed on the substrate, and a contact to the substrate. The contact is formed in an area away from the memory cell and functions to raise the potential of the substrate.

20 Claims, 9 Drawing Sheets

SYSTEM AND METHOD FOR REDUCING PROCESS-INDUCED CHARGING

RELATED APPLICATIONS

The present application is a continuation of U.S. patent application Ser. No. 11/782,507, filed Jul. 24, 2007, which is a divisional application of U.S. patent application Ser. No. 11/146,126, filed Jun. 7, 2005 (now U.S. Pat. No. 7,262,095), the entire contents of which are incorporated by reference herein.

FIELD OF THE INVENTION

Implementations consistent with the principles of the invention relate generally to semiconductor devices and methods of manufacturing semiconductor devices. The invention has particular applicability to non-volatile memory devices.

BACKGROUND OF THE INVENTION

During the formation of a semiconductor memory cell (e.g., during a metal-1 etch and other etches), bit lines tend to acquire high positive voltage (i.e., the bit lines tend to charge up), while the substrate remains at a much lower voltage. This difference in voltage causes band-to-band (BTB) generation of electrons in the source/drain-to-substrate junction of the memory cell and causes the generated electron-hole pairs to be injected into the charge storage area of the memory cell. As a result, the threshold voltage (Vt) of the memory cell increases. This increase in the threshold voltage of the memory cell is commonly referred to as inline process charging, which is a highly undesirable phenomenon.

SUMMARY OF THE INVENTION

In an implementation consistent with the principles of the invention, a method for forming a semiconductor device including a substrate is provided. The method includes forming a memory cell on the substrate, forming a source region, forming a drain region, and forming a metal contact to the substrate. The metal contact reduces generation of electron-hole pairs in the substrate of the semiconductor device.

In another implementation consistent with the principles of the invention, a method for forming a semiconductor device including a substrate is provided. The method includes forming a memory cell on the substrate, forming a source region, forming a drain region, and forming a metal contact to the substrate. The metal contact is formed away from the source region and the drain region.

In yet another implementation consistent with the principles of the invention, a semiconductor device is provided. The semiconductor device includes a substrate, a memory cell formed on the substrate, and a contact to the substrate. The contact is configured to raise a potential of the substrate during etching performed subsequent to formation of the contact.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the principles of the invention refers to the accompanying drawings. The same reference numbers in different drawings may identify the same or similar elements. Also, the following detailed description does not limit the invention. Instead, the scope of the invention is defined by the appended claims and their equivalents.

Exemplary Processing

Figure 1:
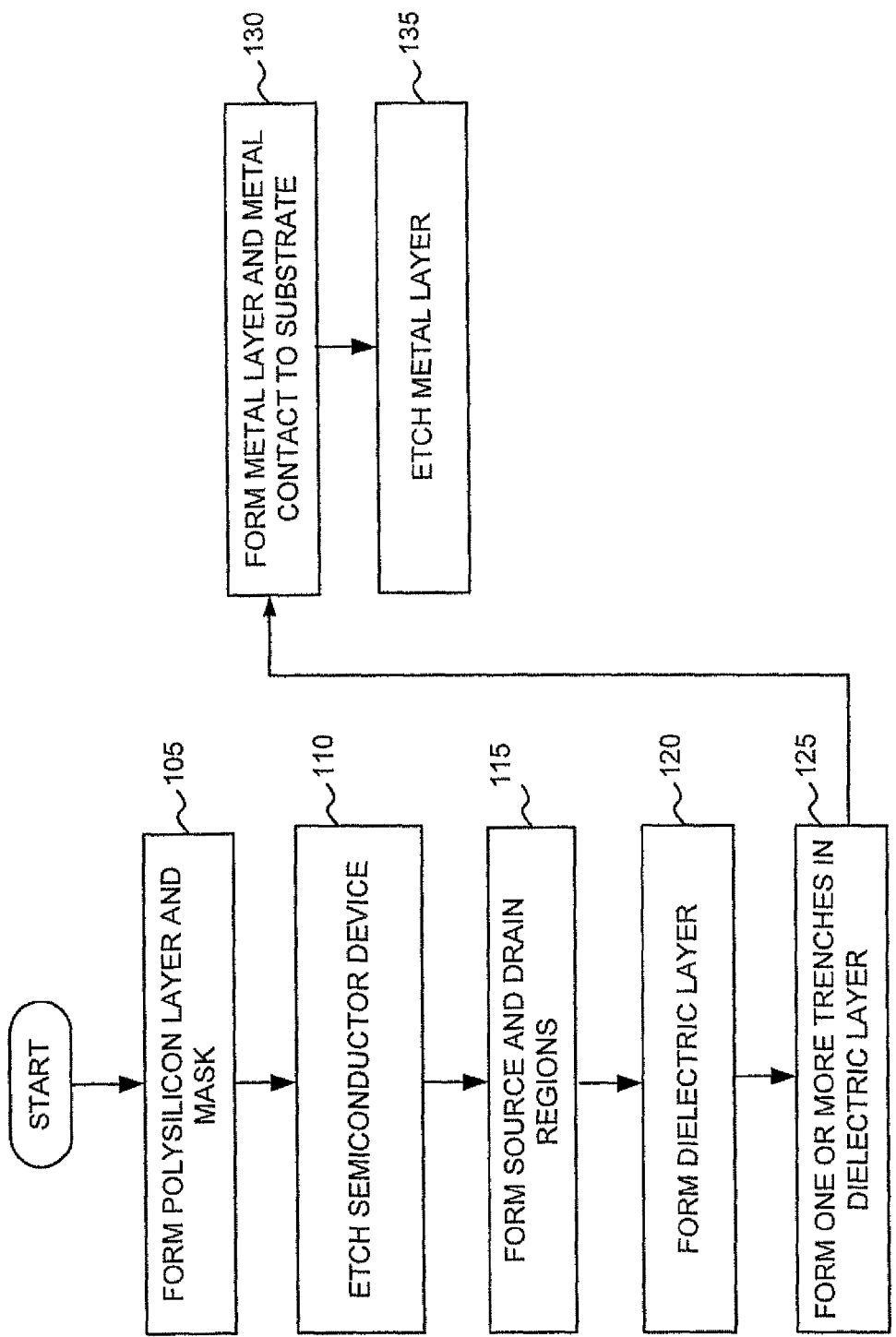
FIG. 1 illustrates an exemplary process for forming a semiconductor memory device in an implementation consistent with the principles of the invention.

FIG. 1 illustrates an exemplary process for forming a semiconductor memory device in an implementation consistent with the principles of the invention. In one implementation, the semiconductor memory device includes a core memory array of a flash memory device. FIGS. 2-9 illustrate exemplary views of a semiconductor memory device fabricated according to the processing described in FIG. 1.

Figure 2:
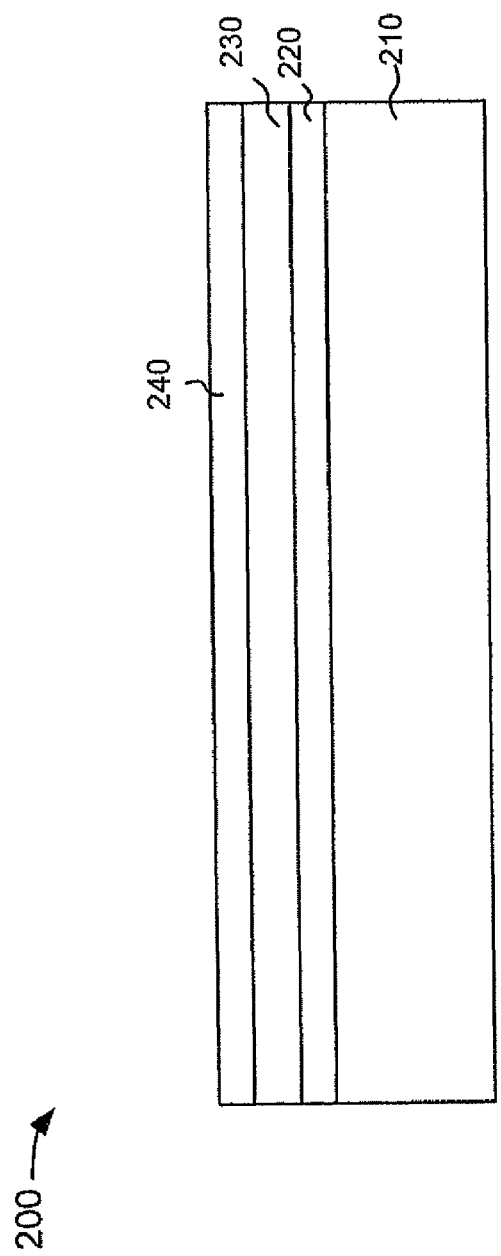
FIGS. 2-9 illustrate exemplary views of a semiconductor memory device fabricated according to the processing described in FIG. 1.

With reference to FIGS. 1 and 2, processing may begin with a semiconductor device 200 that includes layers 210, 220, 230 and 240. In an exemplary implementation, layer 210 may include a substrate of semiconductor device 200 and may include silicon, germanium, silicon-germanium or other semiconducting materials. In alternative implementations, layer 210 may be a conductive layer or a dielectric layer formed a number of layers above the surface of a substrate in semiconductor device 200.

Layer 220 may be a dielectric layer formed on layer 210 in a conventional manner. In an exemplary implementation, dielectric layer 220 may include an oxide, such as a silicon oxide (e.g., $SiO_2$), and may have a thickness ranging from about 70 Å to about 100 Å. Dielectric layer 220 may function as a tunnel oxide layer for a subsequently formed memory cell of semiconductor device 200.

Layer 230 may be formed on layer 220 in a conventional manner and may include a dielectric material, such as a nitride (e.g., a silicon nitride), an oxide, such as $Al_2O_3$ or $HfO_2$, etc. Layer 230, consistent with the invention, may act as a charge storage layer for semiconductor device 200 and may have a thickness ranging from about 60 Å to about 90 Å. Alternatively, layer 230 may include a conductive material, such as polycrystalline silicon, used to form a floating gate electrode for semiconductor device 200.

Layer 240 may be formed on layer 230 in a conventional manner and may include a dielectric material, such as an oxide (e.g., $SiO_2$). Alternatively, layer 240 may include another dielectric material, such as a silicon oxynitride, that may be deposited or thermally grown on layer 230. In still other alternatives, layer 240 may be a composite that includes a number of dielectric layers or films. Layer 240 may have a thickness ranging from about 70 Å to about 100 Å and may function as an inter-gate dielectric for memory cells in semiconductor device 200.

Figure 3:
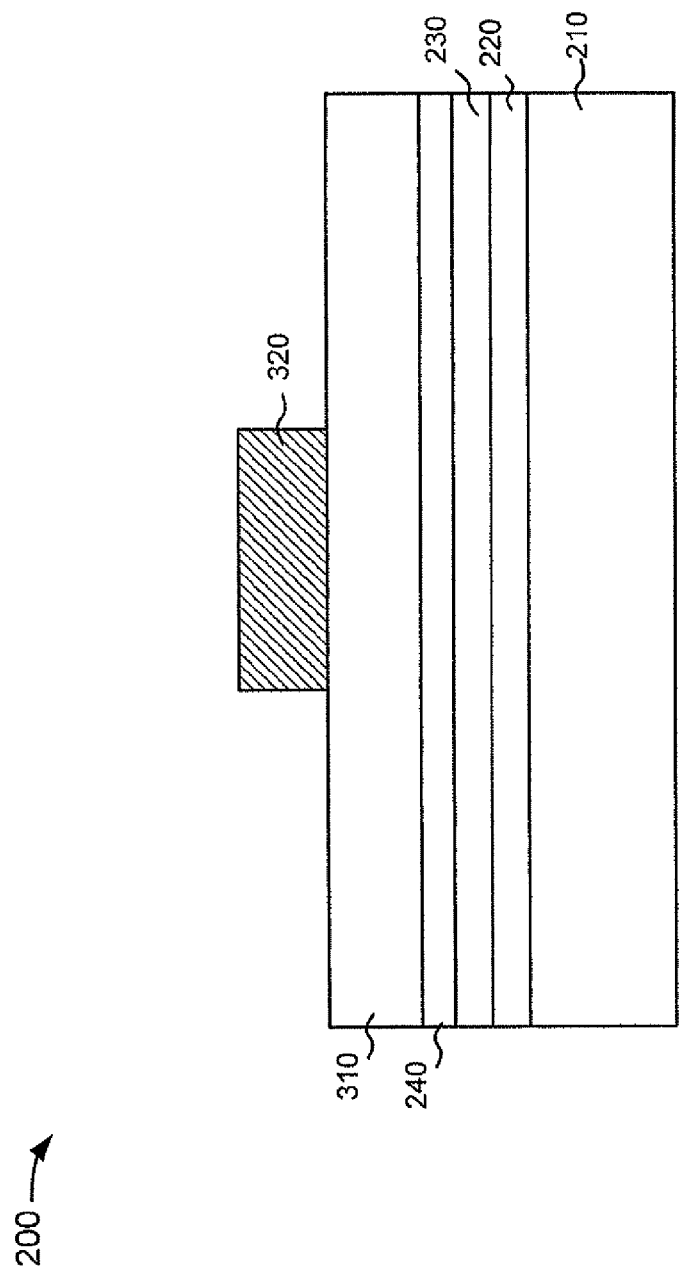

A conductive layer 310, such as polycrystalline silicon, may be formed on dielectric layer 240, as illustrated in FIG. 3 (act 105). Alternatively, conductive layer 310 may include other semiconducting materials, such as germanium or silicon-germanium, or various metals, such as titanium or tungsten. In an exemplary implementation, conductive layer 310 may have a thickness ranging from about 600 Å to about 1500 Å. Conductive layer 310, consistent with the invention, may be used to form one or more control gate electrodes for one or more memory cells in semiconductor device 200. An optional silicide layer, such as titanium silicide (not shown) may be formed on conductive layer 310.

A photoresist material may be patterned and etched to form mask 320 on the top surface of conductive layer 310 (act 105). Mask 320 may be used to facilitate formation of one or memory cells in semiconductor device 200, as described in more detail below. The length and pattern of mask 320 may be selected based on the particular end device requirements.

Figure 4:
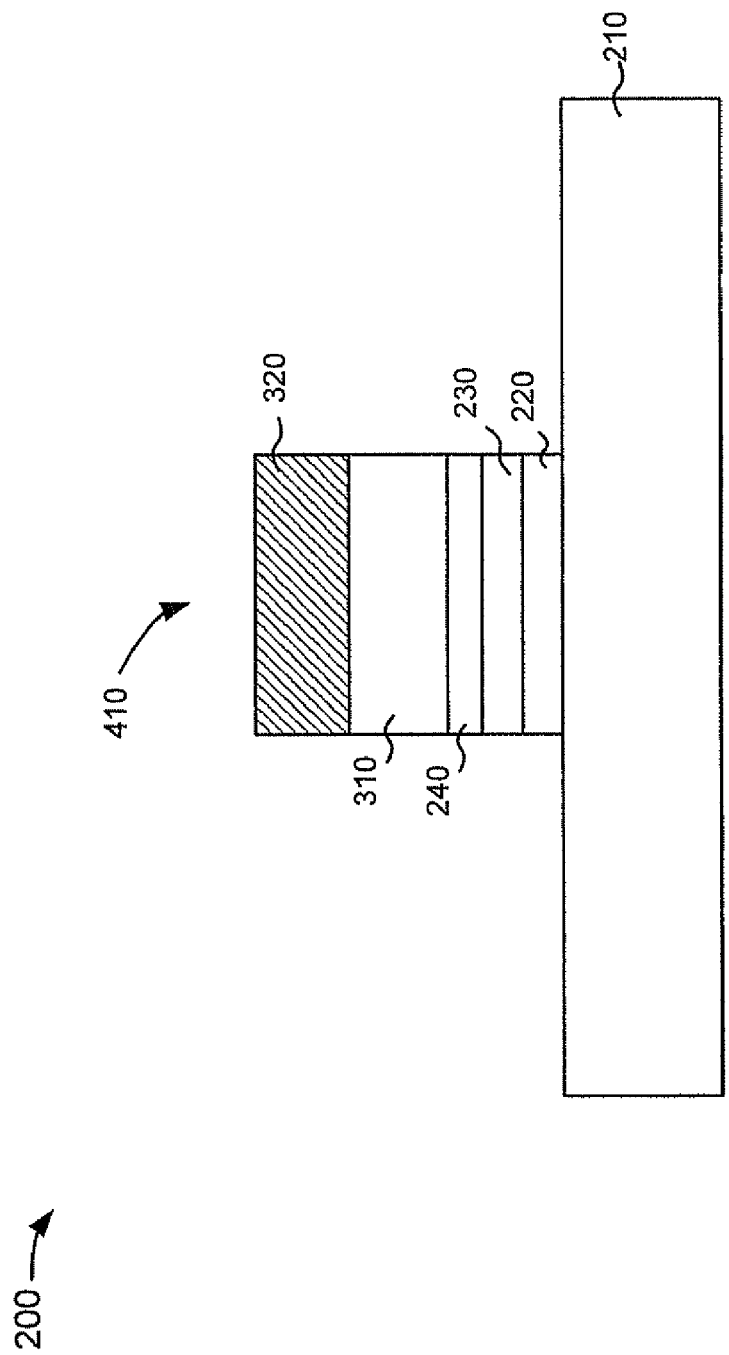

Semiconductor device 200 may then be etched, as illustrated in FIG. 4 (act 110). Referring to FIG. 4, layers 220-240 and 310 may be etched in a conventional manner with the etching terminating at substrate 210, thereby forming structure 410. Alternatively, the etching may terminate at another layer, such as layer 230. Structure 410 (also referred to herein as "memory cell 410") may represent a memory cell of semiconductor device 200, where memory cell 410 includes a dielectric layer 220, a charge storage layer 230, an inter-gate dielectric layer 240, and a control gate electrode 310. Only one memory cell 410 is illustrated in FIG. 4 for simplicity. It should be understood that semiconductor device 200 may typically include a memory array including a large number of memory cells 410.

Figure 5:
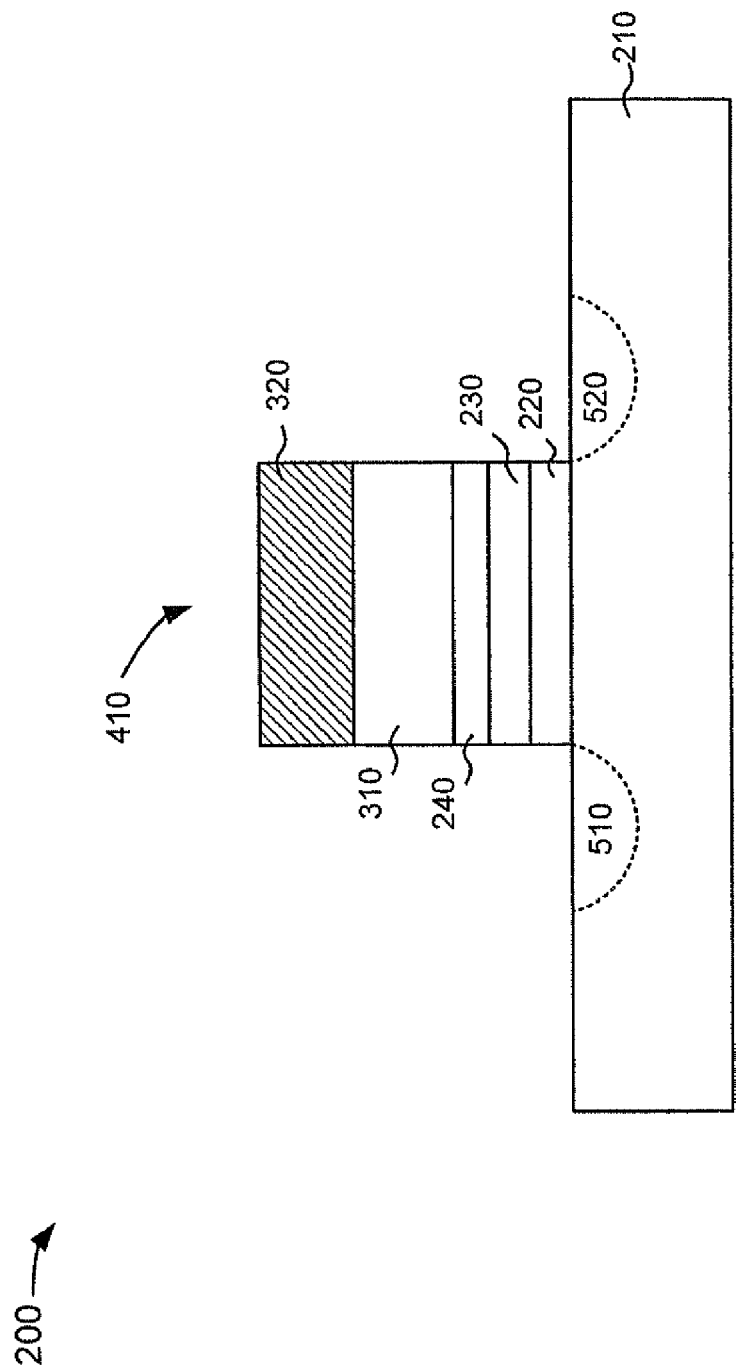

Source and drain regions 510 and 520 may be formed in substrate 210, as illustrated in FIG. 5 (act 115). For example, n-type or p-type impurities may be implanted in substrate 210 to form source and drain regions 510 and 520, based on the particular end device requirements. In one implementation, an n-type dopant, such as phosphorous or arsenic, may be implanted at a dosage ranging from about $5 \times 10^{14}$ atoms/cm$^2$ to about $2 \times 10^{15}$ atoms/cm$^2$ and an implantation energy ranging from about 5 KeV to about 40 KeV. Alternatively, a p-type dopant, such as boron, may be implanted at similar dosages and implantation energies. The particular implantation dosages and energy used to form source and drain regions 510 and 520 may be selected based on the particular end device requirements. One of ordinary skills in the art would be able to optimize the source/drain implantation process based on the particular circuit requirements. It should also be understood that source and drain regions 510 and 520 may alternatively be formed at other points in the fabrication process of semiconductor device 200. For example, sidewall spacers may be formed prior to the source/drain ion implantation to control the location of the source/drain junctions based on the particular circuit requirements. The portion of substrate 210 located adjacent source and drain regions 510 and 520 in substrate 210 is referred to hereinafter as a source/drain-to-substrate junction. It should be further understood that each region 510 and 520 may include a source region and/or a drain region. Each region 510 and 520 will be referred to hereinafter as a source/drain region.

Photoresist mask 320 may then be removed using a conventional process. A dielectric layer 610 may be deposited over semiconductor device 200 (act 120). Dielectric layer 610 (also referred to an interlayer dielectric (ILD)) may be formed to a thickness ranging from about 500 Å to about 2000 Å and may act as an ILD for semiconductor device 200. ILD 610 may include, for example, a phosphosilicate glass (PSG) material, a boro-phosphosilicate (BSPG) material, an oxide, or some other dielectric material.

Figure 6:
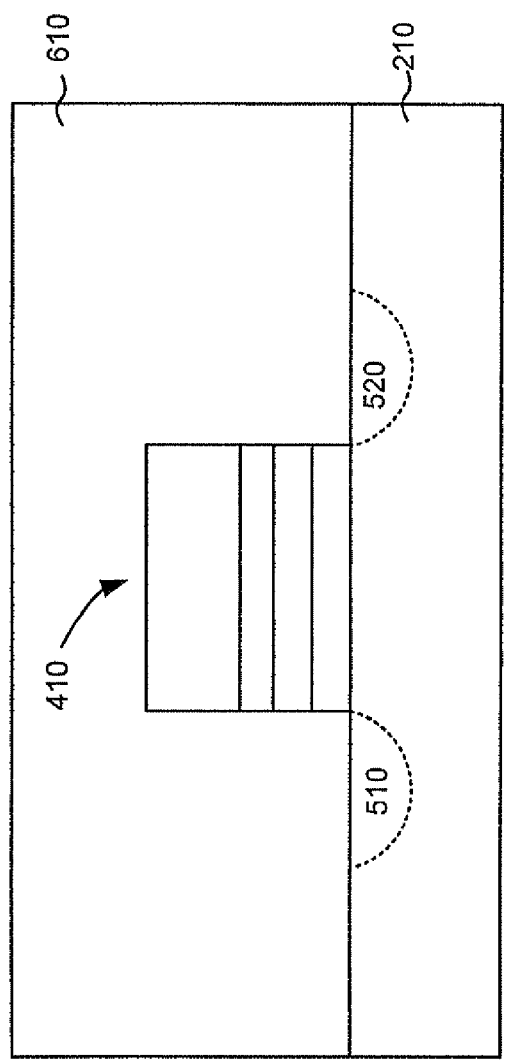

ILD 610 may optionally be planarized using a conventional process, such as a chemical-mechanical polishing (CMP) process. The CMP process may planarize the top surface of ILD 610, as illustrated in FIG. 6, to facilitate formation of subsequent structures, such as interconnect lines. ILD 610 functions to isolate various conductive structures, such as various interconnect lines, source/drain region 510 and/or 520 from an external electrode, etc.

Figure 7:
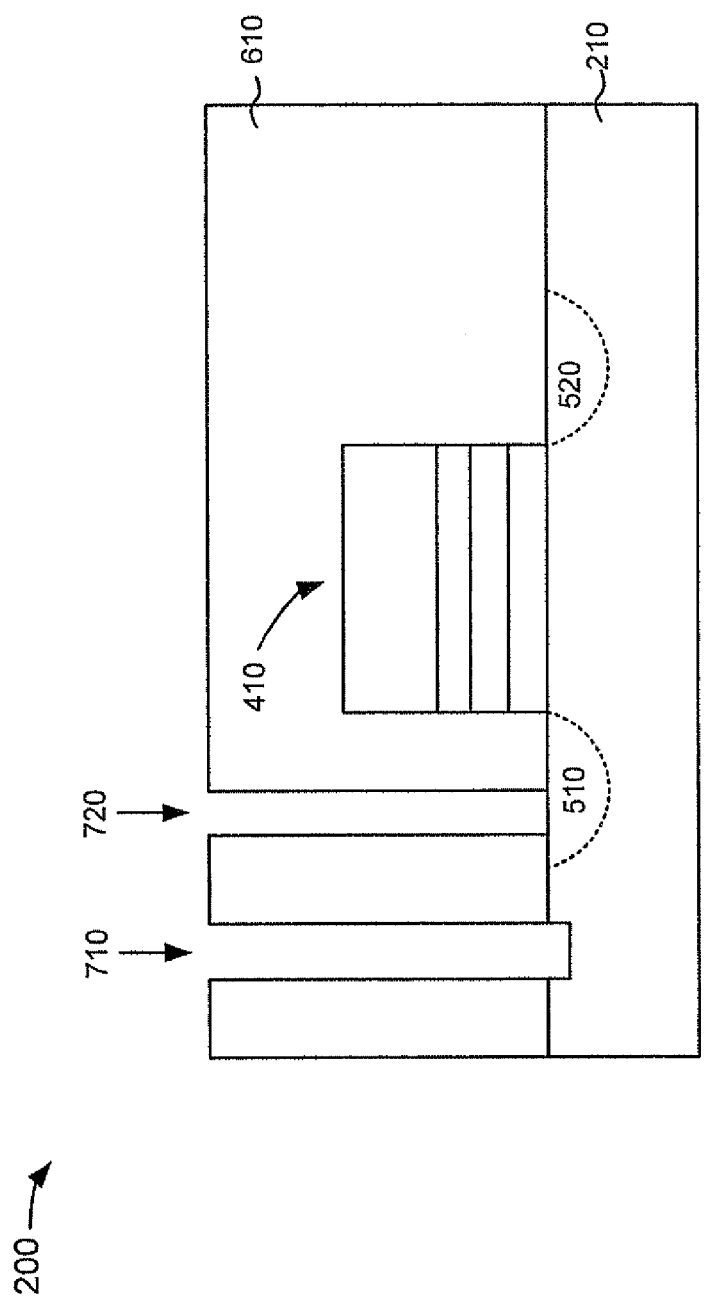

Trenches/contact holes (or vias) may subsequently be formed in ILD 610 using conventional photolithographic and etching techniques, as illustrated in FIG. 7 (act 125). For example, one or more masks may be formed on ILD 610 for forming the trenches. In one implementation, a trench 710 may be created in ILD 610, with the etching terminating in substrate 210. In one implementation, trench 710 may be formed to a depth of about 50 Å to about 200 Å below an upper surface of substrate 210. In other implementations, trench 710 may be formed to a top surface of substrate 210. Trench 710 may be formed to a width ranging from about 250 Å to about 1000 Å and a height ranging from about 500 Å to about 2000 Å. Trench 710 may be formed at a distance from memory cell 410 in an area of semiconductor device 200 away from source/drain regions 510 and 520. As will be described below, trench 710 may be used for forming a metal-1 contact (or antenna) to substrate 210. The term metal-1 refers to the first metal layer formed in semiconductor device 200 located closest to substrate 210.

One or more other trenches 720 may also be created in ILD 610 for forming contacts to, for example, source/drain regions 510 and/or 520, and/or control gate electrode 310 to facilitate programming and/or erasing memory cell 410. Although a single trench 710 and a single trench 720 are illustrated in FIG. 7, it will be appreciated that a greater number of trenches 710 and 720 may alternatively be formed. For example, multiple trenches similar to trench 710 may be formed in ILD 610 into substrate 210 to help eliminate BTB generation of electron-hole pairs at the source/drain-to-substrate junction.

Figure 8:
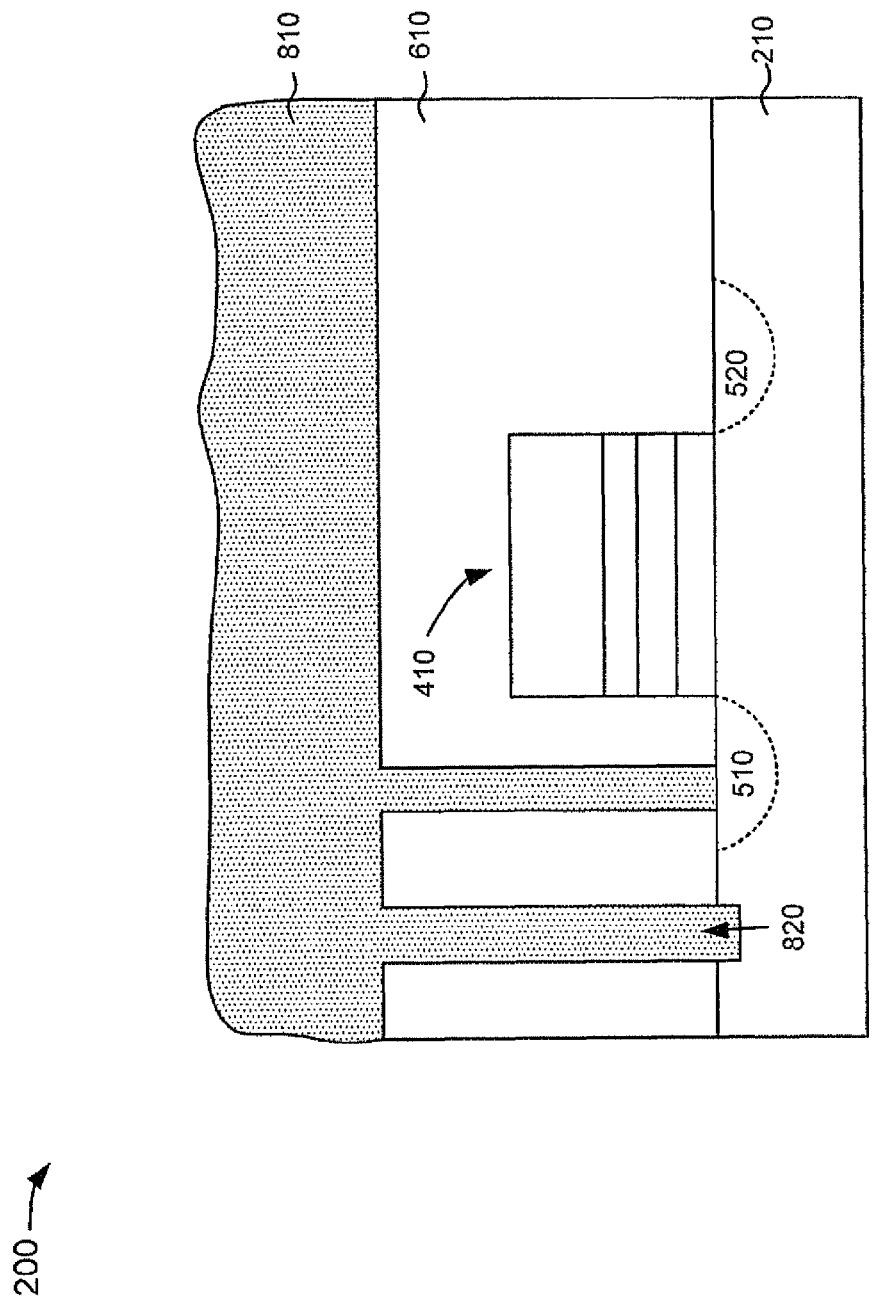

A conductive layer 810 may be formed on semiconductor device 200, as illustrated in FIG. 8 (act 130). In one implementation, conductive layer 810 may be a metal-1 layer, comprising a metal, such as copper, aluminum, or tungsten. Conductive layer 810 may fill trench 710 to form a metal-1 contact (or antenna) 820 to substrate 210. Conductive layer 810 may also fill trench 720 to form a contact to, for example, source/drain region 510. Trench 710 may be filled prior to trench 720 being filled or at the same time that trench 720 is filled.

Figure 9:
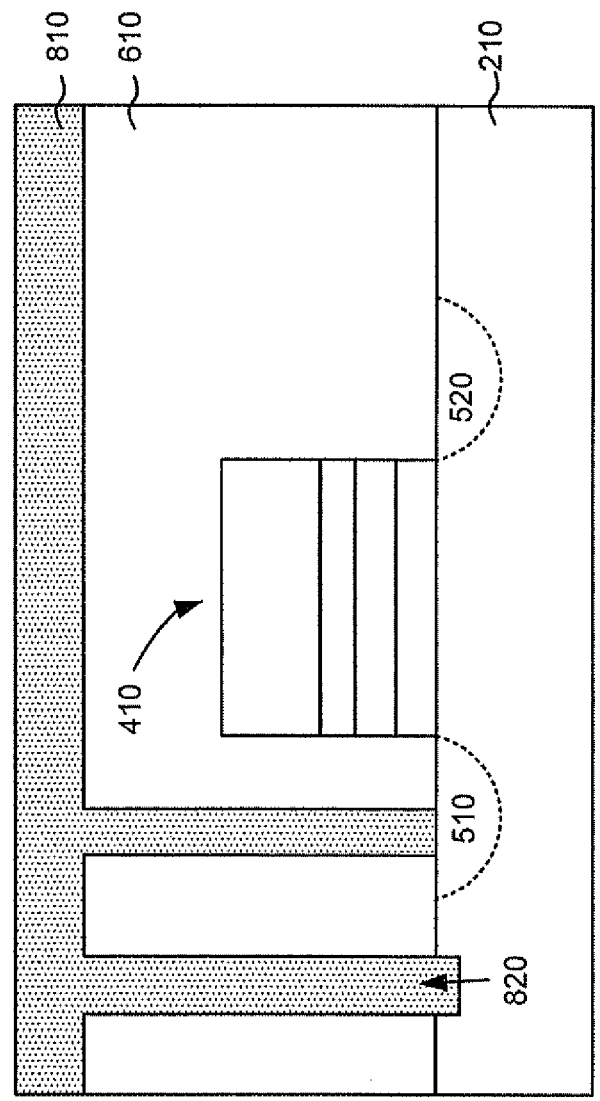

Conductive layer 810 may be etched to form an interconnect line over the planarized top surface of ILD 610, as illustrated in FIG. 9 (act 135). Conductive layer 810 may be etched in a conventional manner. By forming contact 820 into substrate 210, the potential of substrate 210 is raised during the etching of conductive layer 810 and subsequent etches of semiconductor device 200. As a result, the source/drain-to-substrate voltage drop is reduced and BTB electron/hole pair generation is suppressed in substrate 210.

Thus, in implementations consistent with the principles of the invention, a metal-1 contact to the substrate may be formed to reduce or eliminate BTB generation of electron-hole pairs in the source/drain-to-substrate junction of a semiconductor device. As a result, better threshold voltage control of memory cell 410 may be obtained.

Conclusion

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the invention. However, implementations consistent with the invention can be practiced without resorting to the details specifically set forth herein. In other instances, well known processing structures have not been described in detail, in order not to unnecessarily obscure the thrust of the present invention. In practicing the invention, conventional deposition, photolithographic and etching techniques may be employed, and hence, the details of such techniques have not been set forth herein in detail.

While a series of acts has been described with regard to FIG. 1, the order of the acts may be varied in other implementations consistent with the invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A semiconductor device comprising:
   a substrate;
   a memory cell formed on the substrate; and
   a contact into the substrate, where the substrate includes an area that includes a source region and a drain region, where the contact is located outside the area that includes the source region or the drain region.

2. The semiconductor device of claim 1, where the contact has a width ranging from about 250 Å to about 1000 Å.

3. The semiconductor device of claim 1, where the memory cell comprises:
   the source region
   the drain region;
   a first dielectric layer;
   a charge storage layer;
   a second dielectric layer; and
   a conductive layer.

4. The semiconductor device of claim 3, further comprising:
   an interlayer dielectric layer formed on the conductive layer.

5. The semiconductor device of claim 4, further comprising:
   a trench in the interlayer dielectric layer formed to at least one of the source region or the drain region, the trench being filled with a conductive material.

6. The semiconductor device of claim 3, where the first dielectric layer comprises silicon oxide and includes a thickness ranging from about 70 Å to about 100 Å.

7. The semiconductor device of claim 3, where the charge storage layer includes a silicon nitride, an oxide, or polycrystalline silicon, and has a thickness ranging from about 60 Å to about 90 Å.

8. The semiconductor device of claim 3, where the second dielectric layer includes a silicon oxide or a silicon oxynitride, and includes a thickness ranging from about 70 Å to about 100 Å.

9. The semiconductor device of claim 1, where the contact reduces generation of electron-hole pairs in regions in the substrate adjacent the source region and the drain region during an etching process used to form the semiconductor device.

10. The semiconductor device of claim 1, where the substrate comprises at least one of silicon, germanium, or silicon-germanium.

11. The semiconductor device of claim 1, where the contact includes copper, aluminum, or tungsten.

12. A device comprising:
    a substrate;
    a source region formed in the substrate;
    a drain region formed in the substrate; and
    at least one contact formed into the substrate away from the source region and the drain region.

13. The device of claim 12, where the at least one contact is configured to raise a potential of the substrate during etching performed subsequent to formation of the contact.

14. The device of claim 12, where the at least one contact is to reduce generation of electron-hole pairs in regions in the substrate adjacent the source region and the drain region during an etching process used to form the device.

15. The device of claim 12, further comprising:
    a first dielectric layer;
    a charge storage layer;
    a second dielectric layer; and
    a conductive layer.

16. The device of claim 12, where the at least one contact has a width ranging from about 250 Å to about 1000 Å.

17. The device of claim 12, where the at least one contact is formed through the interlayer dielectric into the substrate at a depth ranging from about 50 Å to about 200 Å.

18. A semiconductor device comprising:
    a substrate;
    a memory cell formed on the substrate; and
    a contact having a width ranging from about 250 Å to about 1000 Å and formed into the substrate at a depth ranging from about 50 Å to about 200 Å, where the contact is formed away from a source region and away from a drain region.

19. The semiconductor device of claim 18, where the contact is to raise a potential of the substrate during etching performed subsequent to formation of the contact and reduce generation of electron-hole pairs in regions in the substrate adjacent the source region and the drain region during an etching process used to form the semiconductor device.

20. The semiconductor device of claim 17, where the contact includes copper, aluminum, or tungsten.

* * * * *